(12) United States Patent
Surkanti et al.

(10) Patent No.: US 12,665,510 B2
(45) Date of Patent: Jun. 23, 2026

(54) SEMICONDUCTOR DICE FOR INDUCTOR-BASED SWITCHING POWER CONVERTERS AND ASSOCIATED INTEGRATED CIRCUITS AND SYSTEMS

(71) Applicant: Analog Devices, Inc., Wilmington, MA (US)

(72) Inventors: Punith Kumar Reddy Surkanti, Chandler, AZ (US); Jan Feliks Swidzinski, Gilbert, AZ (US); Michael Hanhart, Gilbert, AZ (US); Yifei Zhu, Chandler, AZ (US)

(73) Assignee: Analog Devices, Inc., Wilmington, MA (US)

( * ) Notice: Subject to any disclaimer, the term of this patent is extended or adjusted under 35 U.S.C. 154(b) by 204 days.

(21) Appl. No.: 18/647,238

(22) Filed: Apr. 26, 2024

(65) Prior Publication Data

US 2025/0337323 A1     Oct. 30, 2025

(51) Int. Cl.
*H02M 3/158* (2006.01)
*H02M 1/08* (2006.01)
(Continued)

(52) U.S. Cl.
CPC ............. *H02M 3/158* (2013.01); *H02M 1/08* (2013.01); *H02M 3/1588* (2013.01); *H02M 7/003* (2013.01); *H10D 1/665* (2025.01)

(58) Field of Classification Search
CPC ...... H02M 3/158; H02M 1/08; H02M 3/1588; H02M 7/003; H10D 1/665
See application file for complete search history.

(56) References Cited

U.S. PATENT DOCUMENTS

| | | | | |
|---|---|---|---|---|
| 7,145,316 B1 * | 12/2006 | Galinski, III | ........... | H02M 1/08 |
| | | | | 323/283 |
| 7,609,036 B2 * | 10/2009 | Bartolo | ................. | H02M 3/157 |
| | | | | 323/283 |

(Continued)

FOREIGN PATENT DOCUMENTS

| | | |
|---|---|---|
| TW | 202101885 A | 1/2021 |

OTHER PUBLICATIONS

Andersen et al., A Feedforward Controlled On-Chip Switched-Capacitor Voltage Regulator Delivering 10W in 32nm SOI CMOS, 2015 IEEE International Solid-State Circuits Conference—(ISSCC) Digest of Technical Papers, pp. 362-365, 2015.

(Continued)

*Primary Examiner* — Yusef A Ahmed
(74) *Attorney, Agent, or Firm* — ArentFox Schiff LLP

(57) ABSTRACT

A semiconductor die for an inductor-based switching power converter includes a semiconductor layer stack, a first enhancement mode, N-channel metal oxide semiconductor field effect transistor (first NMOS FET) formed in the semiconductor layer stack, a second enhancement mode, N-channel metal oxide semiconductor field effect transistor (second NMOS FET) formed in the semiconductor layer stack, first driver circuitry formed in the semiconductor layer stack, second driver circuitry formed in the semiconductor layer stack, and bootstrap capacitance. The first driver circuitry is configured to drive the first gate from a bootstrap power rail in response to a first control signal, and the second driver circuitry is configured to drive the second gate in response to a second control signal. The bootstrap capacitance includes one or more bootstrap trench capacitors formed in the semiconductor layer stack, and each bootstrap capacitor is electrically coupled between the bootstrap power rail and the switching node.

13 Claims, 9 Drawing Sheets

(51) Int. Cl.
　　H02M 7/00　　　　　(2006.01)
　　H10D 1/66　　　　　(2025.01)

(56)　　　　　　References Cited

U.S. PATENT DOCUMENTS

| | | | | |
|---|---|---|---|---|
| 8,174,248 | B2 * | 5/2012 | Mavencamp | H02M 3/1588 |
| | | | | 323/225 |
| 8,203,380 | B2 * | 6/2012 | Hashimoto | H10D 84/811 |
| | | | | 327/566 |
| 8,207,720 | B2 * | 6/2012 | Tang | H02M 3/156 |
| | | | | 323/901 |
| 8,502,511 | B1 * | 8/2013 | Kung | H02M 3/1588 |
| | | | | 323/272 |
| 8,836,300 | B2 * | 9/2014 | Sohma | H02M 3/1588 |
| | | | | 323/272 |
| 9,312,773 | B2 * | 4/2016 | Li | H03K 17/063 |
| 9,577,506 | B1 * | 2/2017 | Chin | H03K 17/063 |
| 9,819,267 | B2 * | 11/2017 | Koli | H02M 1/38 |
| 9,929,652 | B1 * | 3/2018 | Ribarich | H02M 3/158 |
| 10,361,620 | B2 * | 7/2019 | Lee | H02M 3/155 |
| 10,622,896 | B1 | 4/2020 | Eggermont | |
| 11,183,452 | B1 * | 11/2021 | Mueller-Meskamp | |
| | | | | H01L 21/76283 |
| 2003/0085418 | A1 | 5/2003 | Hazucha et al. | |
| 2007/0046275 | A1 * | 3/2007 | Shirai | H03K 17/165 |
| | | | | 323/284 |
| 2007/0159150 | A1 * | 7/2007 | Hosokawa | H03K 17/687 |
| | | | | 323/285 |
| 2008/0018311 | A1 * | 1/2008 | Sakai | H03K 17/063 |
| | | | | 327/333 |
| 2011/0012570 | A1 * | 1/2011 | Liu | H05B 45/38 |
| | | | | 323/225 |
| 2011/0188218 | A1 * | 8/2011 | Hsing | H01R 9/00 |
| | | | | 361/772 |
| 2012/0176113 | A1 * | 7/2012 | Grant | H02M 3/156 |
| | | | | 323/285 |
| 2013/0106374 | A1 * | 5/2013 | Ball | H02M 3/1588 |
| | | | | 323/271 |

| | | | | |
|---|---|---|---|---|
| 2016/0043072 | A1 * | 2/2016 | Vielemeyer | H10D 84/811 |
| | | | | 327/109 |
| 2016/0247751 | A1 * | 8/2016 | Kinzer | H01L 23/49575 |
| 2017/0054369 | A1 * | 2/2017 | Chin | G05F 1/61 |
| 2018/0076711 | A1 * | 3/2018 | Ulbrich | H02M 1/34 |
| 2019/0013725 | A1 * | 1/2019 | Shinozaki | H02M 3/1588 |
| 2019/0260375 | A1 * | 8/2019 | Yang | H03K 3/3565 |
| 2020/0027957 | A1 * | 1/2020 | Umemoto | H10D 30/60 |
| 2020/0251976 | A1 * | 8/2020 | Jodka | H03K 17/063 |
| 2020/0304023 | A1 | 9/2020 | Hiensch | |
| 2020/0373846 | A1 | 11/2020 | Chromcak | |
| 2021/0152075 | A1 * | 5/2021 | Akahane | H03K 19/018521 |
| 2021/0167774 | A1 * | 6/2021 | Karasawa | H02M 3/015 |
| 2021/0391795 | A1 * | 12/2021 | Gandhi | H02M 3/1582 |
| 2022/0311321 | A1 * | 9/2022 | Venturelli | H02P 7/293 |
| 2022/0393593 | A1 * | 12/2022 | Fukushima | H02M 1/08 |
| 2023/0059963 | A1 * | 2/2023 | Yoon | H02M 1/0006 |
| 2023/0129526 | A1 * | 4/2023 | Fukushima | H03K 17/6871 |
| | | | | 327/108 |
| 2023/0130933 | A1 * | 4/2023 | Fukushima | H02M 3/18 |
| | | | | 323/205 |
| 2024/0106318 | A1 * | 3/2024 | Kwak | H02M 1/08 |
| 2024/0146193 | A1 * | 5/2024 | Fukushima | H02M 3/158 |

OTHER PUBLICATIONS

Anderson et al., A 10 W On-Chip Switched Capacitor Voltage Regulator With Feedforward Regulation Capability for Granular Microprocessor Power Delivery, IEEE Trans. on Power Electronics, pp. 378-393, vol. 32, No. 1, Jan. 2017.

Andersen et al., A Deep Trench Capacitor Based 2:1 and 3:2 Reconfigurable On-Chip Switched Capacitor DC-DC Converter in 32 nm SOI CMOS, 2014 IEEE Applied Power Electronics Conference and Exposition—APEC 2014, pp. 1448-1455, 2014.

LTC7150S/LTC7150S-4 Data Sheet, Analog Devices, 22 pages, Jun. 2019.

MAXM17536 Data Sheet, Maxim Integrated Products, 22 pages, Aug. 2019.

* cited by examiner

SEMICONDUCTOR DICE FOR INDUCTOR-BASED SWITCHING POWER CONVERTERS AND ASSOCIATED INTEGRATED CIRCUITS AND SYSTEMS

BACKGROUND

Switching power converters are widely used in electronic devices, such as to provide a regulated electrical power source. A switching power converter is configured such that its solid-state power switching devices do not continuously operate in their active states; instead, the switching devices repeatedly switch between their on-states and off-states. As such, a switching power converter may be capable of achieving high efficiency, particularly at high current levels. Classes of switching power converters include inductor-based switching power converters and switched capacitor switching power converters. An inductor-based switching power converter includes at least one inductor and one or more switching devices configured to repeatedly charge and discharge the inductor to perform power conversion. A switched capacitor switching power converter, in contrast, does not rely on charging and discharging of an inductor for power conversion. Instead, a switched capacitor switching power converter includes at least one capacitor and one or more switching devices to repeatedly charge and discharge the capacitor to perform power conversion.

DETAILED DESCRIPTION OF THE EMBODIMENTS

Figure 1:
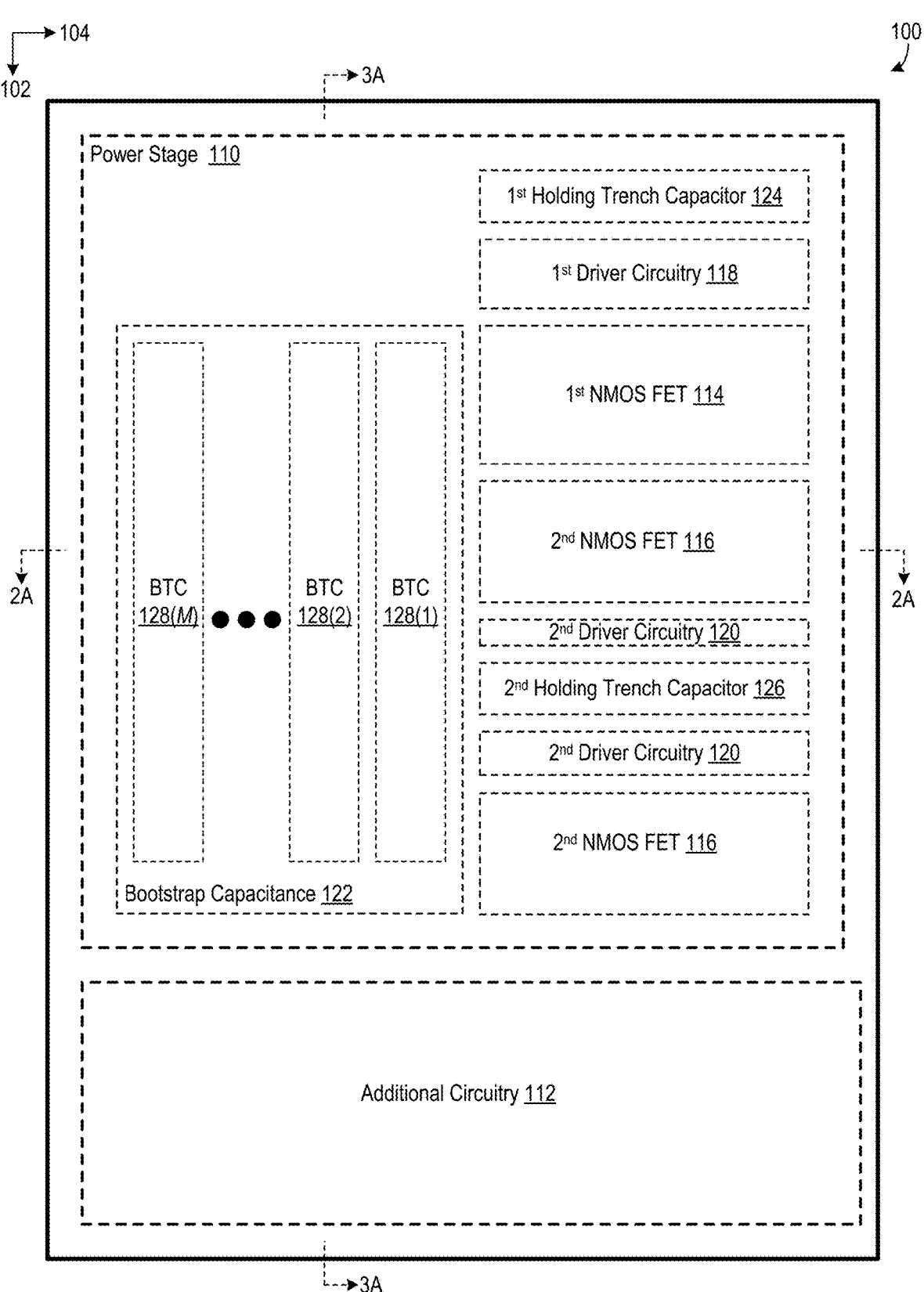
FIG. 1 is a top plan view of a semiconductor die, according to an embodiment.

A switching power converter having a buck topology, frequently referred to as a buck converter, commonly includes two switching devices, i.e., a first or upper switching device and a second or lower switching device. The first switching device is electrically coupled between a first power node and a switching node, where the first power node is, for example, an input power node. The second switching device is electrically coupled between the switching node and a second power node, where the second power node is, for example, a ground node. An inductor is electrically coupled between the switching node and an output power node, and an output capacitor is electrically coupled between the output power node and the second power node. A controller modulates duty cycle of the first switching device, such as using a pulse width modulation (PWM) technique or a pulse frequency modulation (PFM) technique, to regulate one or more parameters of the switching power converter. The controller controls the second switching device so that the second switching device performs a freewheeling function, i.e., the second switching device provides a path for current flowing through the inductor when the first switching device is in its off-state. Some buck converters omit the second switching device and include a diode in its place.

It is often desirable to integrate multiple components of a buck converter, such as switching devices, and control circuitry, in an integrated circuit. Switching devices in modern buck converters are commonly implemented by enhancement mode, field effect transistors (FETs) due to the relative ease of driving a FET and the relative fast switching capability of a FET. Additionally, FETs are widely supported in modern integrated circuit fabrication processes. FETs can be classified as either N-channel FETs or P-channel FETs. An N-channel FET requires a positive gate-to-source voltage for driving the FET, while a P-channel FET requires a positive source-to-gate voltage (or negative gate-to-source voltage) for driving the FET. N-channel FETs typically have a higher power density than P-channel FETs, and an N-channel FET typically has a lower on-resistance than a P-channel FET of similar size. Therefore, it is generally desirable to implement switching devices of a buck converter with N-channel FETs, particularly in high current applications where FET on-resistance may cause significant conduction losses. However, a power supply referenced to the switching node is required to drive the gate of an N-channel FET serving as a first switching device, due to the N-channel FET being referenced to the switching node.

A power supply referenced to the switching node of a buck converter can be realized using a bootstrap capacitor between a bootstrap power rail and the switching node, where the bootstrap capacitor is charged when the second switching device is in its on-state. A voltage across the bootstrap capacitor is referenced to the switching node, and the bootstrap capacitor powers the bootstrap power rail. As such, the bootstrap power rail can be used to drive the gate of an N-channel FET implementing the first switching device when the second switching device is in its off-state.

However, conventional use of a bootstrap capacitor has significant drawbacks. For example, a bootstrap capacitor is conventionally located outside of a semiconductor die implementing a buck converter power stage. As such, electrical conductors, such as an integrated circuit package terminal, commonly referred to as a "pin," and one or more printed circuit board (PCB) traces, are required to electrically couple the bootstrap capacitor to the semiconductor die. Consequently, use of a bootstrap capacitor external to an integrated circuit implementing a buck converter power stage requires that the integrated circuit include a pin dedicated to the bootstrap capacitor. Such requirement for a dedicated bootstrap capacitor pin is frequently undesirable because integrated circuit pins contribute to size and cost of an integrated circuit. Additionally, the quantity of pins available in an integrated circuit package may be limited. For example, the requirement for a dedicated bootstrap capacitor pin for each buck converter in an integrated circuit supporting multiple buck converters may prohibitively increase pin count. Additionally, electrical conductors, such as PCB traces, electrically coupling a bootstrap capacitor to an integrated circuit may be difficult to route, and such conductors contribute to parasitic impedance of an electrical circuit including the bootstrap capacitor. This parasitic impedance is undesirable because it may limit buck converter switching frequency, contribute to power losses, and/or generate ringing or other noise which causes electromagnetic interference (EMI) with other electrical circuitry.

The requirement for a dedicated bootstrap capacitor pin on an integrated circuit supporting a buck converter can be overcome by co-packaging a bootstrap capacitor and a semiconductor die, where the bootstrap capacitor is electrically coupled to the semiconductor die within the package by one or more electrical conductors. However, an integrated circuit package capable of housing both a semiconductor die and a bootstrap capacitor may be relatively costly and large. Additionally, electrical conductors electrically coupling the bootstrap capacitor to the semiconductor die within the integrated circuit package also undesirably contribute to parasitic impedance of an electrical circuit including the bootstrap capacitor.

Disclosed herein are new semiconductor dice for inductor-based switching power converters which at least partially overcome the drawbacks discussed above. The new semiconductor dice include bootstrap capacitance within the dice, thereby eliminating the need for external bootstrap capacitors. As such, an integrated circuit including an embodiment of the new semiconductor dice does not require a dedicated pin for a bootstrap capacitor, thereby promoting small integrated circuit size and low integrated circuit cost, particularly in embodiments supporting multiple inductor-based switching power converters on a single die, such as discussed below with respect to FIG. 13. Additionally, the fact that bootstrap capacitance is included within the new semiconductor dice helps minimize parasitic impedance of an electrical circuit including the bootstrap capacitor, thereby facilitating high switching frequency and fast switching edge rates, as well as helping minimize power losses, EMI potential, and need for voltage derating as a function of temperature. Furthermore, the fact that bootstrap capacitance is integrated in the semiconductor dice promotes low component count by eliminating the need for an external bootstrap capacitor. Low component count, in turn, promotes small size, low cost, ease of manufacturing, and high reliability. In particular embodiments, bootstrap capacitance is implemented in a semiconductor die by one or more trench capacitors along with enhancement mode, N-channel metal oxide semiconductor field effect transistors (NMOS FETs), where the bootstrap capacitance and NMOS FETs are formed using a complementary metal oxide semiconductor (CMOS) integrated circuit fabrication process.

Figures 2, 3:
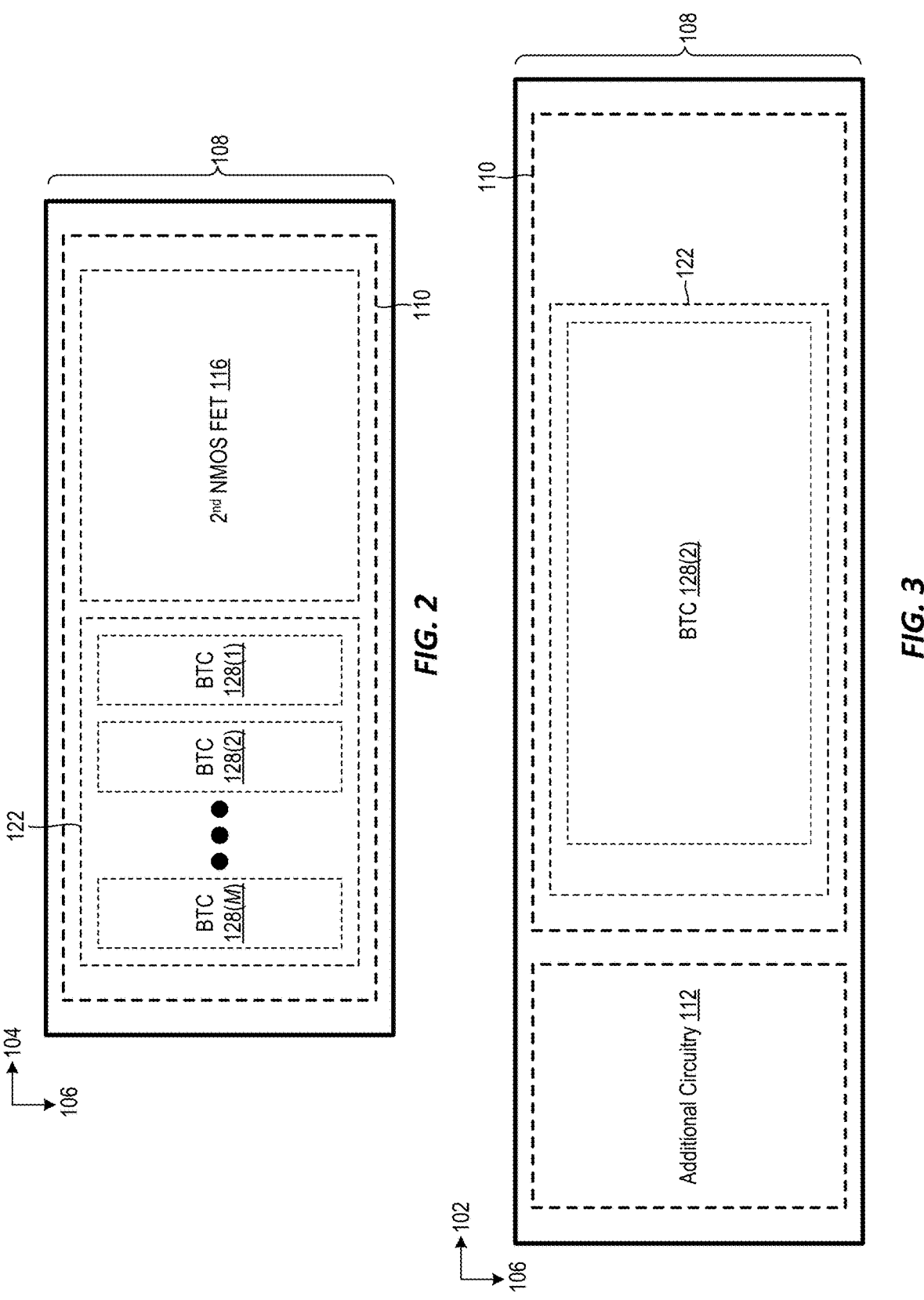
FIG. 2 is a cross-sectional view of the FIG. 1 semiconductor die taken along line 2A-2A of FIG. 1.
FIG. 3 is a cross-sectional view of the FIG. 1 semiconductor die taken along line 3A-3A of FIG. 1.

FIG. 1 is a top plan view of a semiconductor die 100, which is one embodiment of the new semiconductor dice disclosed herein. FIG. 2 is a cross-sectional view of semiconductor die 100 taken along line 2A-2A of FIG. 1, and FIG. 3 is a cross-sectional view of semiconductor die 100 taken along line 3A-3A of FIG. 1. FIGS. 1-3 collectively illustrates directions 102, 104 and 106, where (i) direction 102 is orthogonal to each of direction 104 and direction 106, (ii) direction 104 is orthogonal to each of direction 102 and direction 106, and (iii) direction 106 is orthogonal to each of direction 102 and direction 104.

Semiconductor die 100 includes a semiconductor layer stack 108 (see FIGS. 2 and 3), where semiconductor layer stack 108 includes a power stage 110 and additional circuitry 112 formed therein. Power stage 110 includes a first NMOS FET 114 formed in semiconductor layer stack 108, a second NMOS FET 116 formed in semiconductor layer stack 108, first driver circuitry 118 formed in semiconductor layer stack 108, second driver circuitry 120 formed in semiconductor layer stack 108, bootstrap capacitance 122 formed in semiconductor layer stack 108, a first holding trench capacitor 124 formed in semiconductor layer stack 108, and a second holding trench capacitor 126 formed in semiconductor layer stack 108. Bootstrap capacitance 122 includes M bootstrap trench capacitors (BTCs) 128 formed in semiconductor layer stack 108, where M is a positive integer. While the present figures depict M being at least three, it is understood that M could alternately be two or one. In this document, specific instances of an item may be referred to by use of a numeral in parentheses (e.g. bootstrap trench capacitor 128(1)) while numerals without parentheses refer to any such item (e.g. bootstrap trench capacitors 128).

The elements of power stage 110 are symbolically shown by dashed line rectangles in the present figures, although it is understood that respective shapes of the elements of power stage 110 may vary. Additionally, the present figures depict one example of a floorplan of the elements of power stage 110, as well as one example of relative sizes of the elements of power stage 110. However, the floorplan and/or sizes of the elements of power stage 110 are a design choice and accordingly may vary from that depicted in the present figures. In the example floorplan of the present figures, second NMOS FET 116 is split into two portions separated from each other in direction 102 by second driver circuitry 120 and second holding trench capacitor 126. Additionally, second driver circuitry 120 is split into two portions that are separated from each other in direction 102 by second holding trench capacitor 126, in the example floorplan of the present figures. Additional circuitry 112 includes elements of semiconductor die 100 other than the elements of power stage 110. While additional circuitry 112 is symbolically shown as a rectangular box, the size, shape, and placement of additional circuitry 112 in semiconductor die 100 may vary as a design choice. For example, additional circuitry 112 may be split into multiple elements that are distributed among two or more portions semiconductor die 100, instead of being grouped in a common portion of semiconductor die 100. Furthermore, semiconductor die 100 may be modified to include additional elements. For example, some alternate embodiments of semiconductor die 100 include multiple power stages, such that the semiconductor die may support multiple inductor-based switching power converters. As another example, power stage 110 could include additional elements without departing from the scope hereof.

Figure 4:
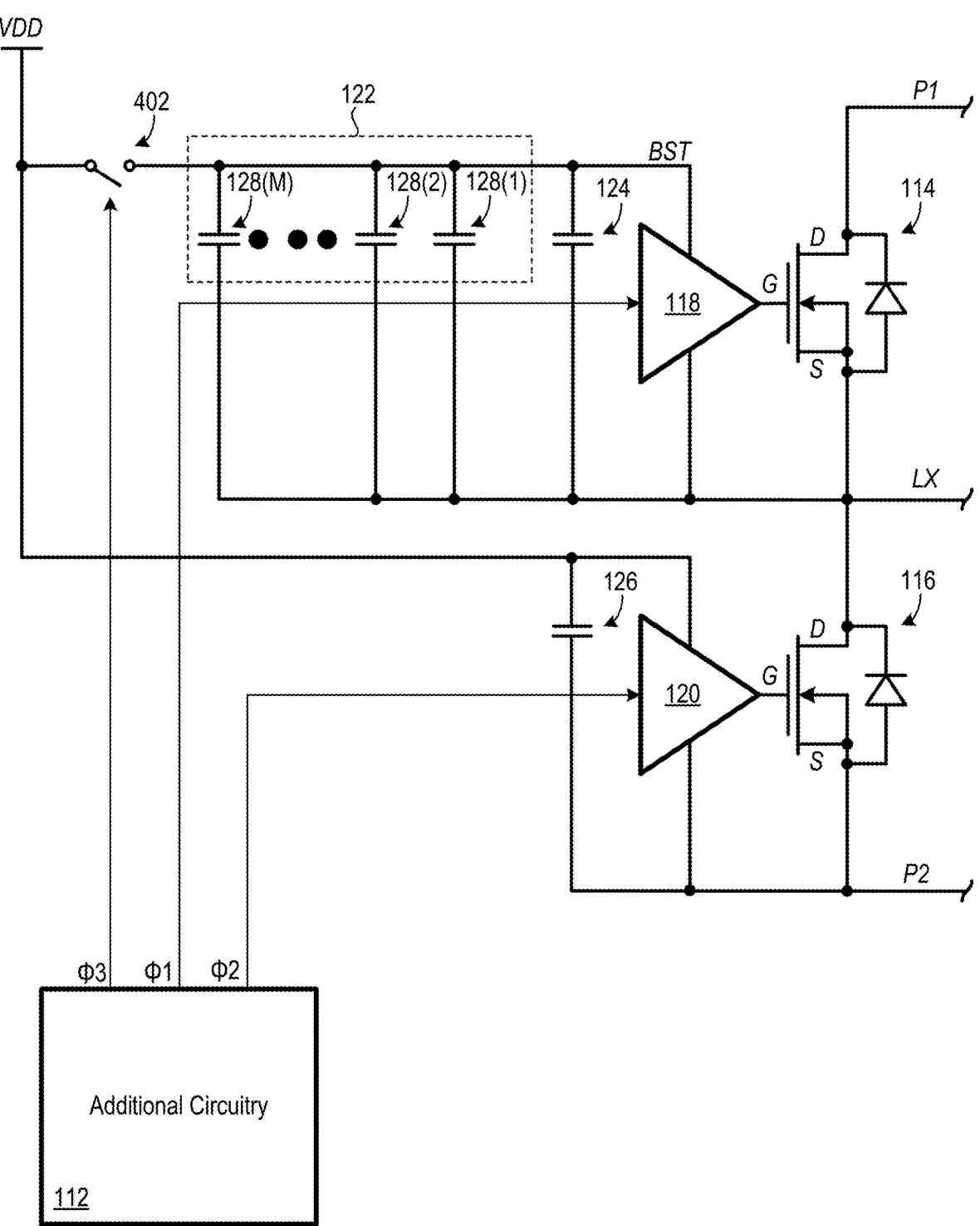
FIG. 4 is an electrical schematic diagram of the FIG. 1 semiconductor die.

FIG. 4 is an electrical schematic diagram of semiconductor die 100. Each of first NMOS FET 114 and second NMOS FET 116 includes a respective drain (D), a respective source(S), and a respective gate (G). Each of first NMOS FET 114 and second NMOS FET 116 further includes a respective body diode, where the body diodes are depicted, but not labeled, in FIG. 4. The drain of first NMOS FET 114 is electrically coupled to a first power node P1, and the source of first NMOS FET 114 is electrically coupled to a switching node LX. The drain of second NMOS FET 116 is electrically coupled to switching node LX, and the source of second NMOS FET 116 is electrically coupled to a second power node P2. In some embodiments, first power node P1 is an input power, and second power node P2 is a ground node or another reference node. First driver circuitry 118 is configured to drive the gate of first NMOS FET 114 in response to a control signal φ1 generated by additional circuitry 112, and second driver circuitry 120 is configured to drive the gate of second NMOS FET 116 in response to a control signal φ2 generated by additional circuitry 112.

First driver circuitry 118 is powered from a bootstrap power rail BST, and first driver circuitry 118 is referenced to switching node LX. Accordingly, first driver circuitry 118 is configured to drive the gate of first NMOS FET 114 from bootstrap power rail BST by switching the gate of first NMOS FET 114 between bootstrap power rail BST and switching node LX. For example, in certain embodiments, first driver circuitry 118 is configured to (i) connect the gate of first NMOS FET to bootstrap power rail BST when control signal φ1 is asserted, and (ii) connect the gate of first NMOS FET to switching node LX when control signal φ1 is de-asserted. First NMOS FET 114 operates in its on-state when its gate is connected to bootstrap power rail BST, and first NMOS FET 114 operates in its off-state when its gate is connected to switching node LX. In this document, an NMOS FET or other switching device operates in its on-state when it is being controlled to operate in its conductive state, and an NMOS FET or other switching device operates in its off-state when it is being controlled to operate in non-conductive state.

Each bootstrap trench capacitor 128 of bootstrap capacitance 122 is electrically coupled between bootstrap power rail BST and switching node LX, and first holding trench capacitor 124 is also electrically coupled between bootstrap power rail BST and switching node LX. Power stage 110 further includes bootstrap control circuitry 402 formed in semiconductor layer stack 108 (not shown in FIGS. 1-3) electrically coupled between a digital power supply rail VDD and bootstrap power rail BST, for controlling charging of bootstrap capacitance 122. In this example, bootstrap control circuitry 402 includes a switch controlled by a control signal φ3 generated by additional circuitry 112. Specifically, additional circuitry 112 generates control signal φ3 such that (i) the switch of bootstrap control circuitry 402 is closed when second NMOS FET 116 is in its on-state and (ii) the switch of bootstrap control circuitry 402 is open when second NMOS FET 116 is in its off-state. Consequently, each bootstrap trench capacitor 128 charges to a voltage approximately equal to the voltage of digital power supply rail VDD when second NMOS FET 116 is in its on-state, and bootstrap trench capacitors 128 power bootstrap power rail BST at a voltage approximately equal to the voltage of digital power supply rail VDD, but referenced to switching node LX, when second NMOS FET 116 is in its off-state. The configuration of bootstrap control circuitry 402 could vary without departing from the scope hereof. For example, bootstrap control circuitry 402 could alternately be embodied by a diode in place of a switch, or bootstrap control circuitry 402 could further include voltage regulation circuitry, such as to regulate voltage of bootstrap power rail BST.

Second driver circuitry 120 is powered from digital power supply rail VDD, and second driver circuitry 120 is referenced to second power node P2. Accordingly, second driver circuitry 120 is configured to drive the gate of second NMOS FET 116 from digital power supply rail VDD by switching the gate of second NMOS FET 116 between digital power supply rail VDD and second power node P2. For example, in certain embodiments, second driver circuitry 120 is configured to (i) connect the gate of second NMOS FET 116 to digital power supply rail VDD when control signal φ2 is asserted, and (ii) connect the gate of second NMOS FET 116 to second power node P2 when control signal φ2 is de-asserted. Second NMOS FET 116 operates in its on-state when its gate is connected to digital power supply rail VDD, and second NMOS FET 116 operates in its off-state when its gate is connected to second power node P2.

Additional circuitry 112 includes, for example, PWM and/or PFM circuitry (not shown), level shifting circuitry (not shown), an error amplifier (not shown), and bootstrap logic circuitry (not shown), for generating control signals φ1, φ2, and φ3. In some embodiments, additional circuitry 112 is configured to generate control signal φ1 to modulate duty cycle of first NMOS FET 114 to regulate one or parameters of a buck converter including semiconductor die 100, such as magnitude of input voltage, magnitude of output voltage, magnitude of input current, or magnitude of output current. Additional circuitry 112 may include circuitry for performing additional functions related to a buck converter incorporating semiconductor die 100. For example, additional circuitry 112 may include buck converter protection circuitry and/or circuitry for implementing current mode control. Additional circuitry 112 may also include circuitry for performing additional functions that are not directly related to, or are unrelated to, operation of a buck converter incorporating semiconductor die 100. For example, additional circuitry 112 may include telemetry circuitry.

Referring again to FIGS. 1-3, in particular embodiments, semiconductor die 100 is formed using a CMOS fabrication process. As known in the art, a semiconductor die formed using a CMOS fabrication process includes a silicon substrate electrically coupled to an electrical node having a lowest electrical potential of any electrical node of the semiconductor die, such as a ground node. While not required, the silicon substrate is frequently a lightly doped P-type silicon substrate. Additional layers are formed on the silicon substrate to create metal oxide semiconductor (MOS) channels. Parasitic elements, such as P-N junctions, leakage paths, and capacitance, are referenced to the silicon substrate, as the bulk or body of MOS elements. In a NMOS FET formed using a CMOS fabrication process with a P-type silicon substrate, the P-type silicon substrate is the bulk of an NMOS FET. In an enhancement mode, P-type metal oxide semiconductor field effect transistor (PMOS FET) formed using a CMOS fabrication process with a P-type silicon substrate, an N-well is the bulk of the PMOS FET, and the N-well is a lightly doped N-type layer on the P-type silicon substrate.

Figures 5, 6:
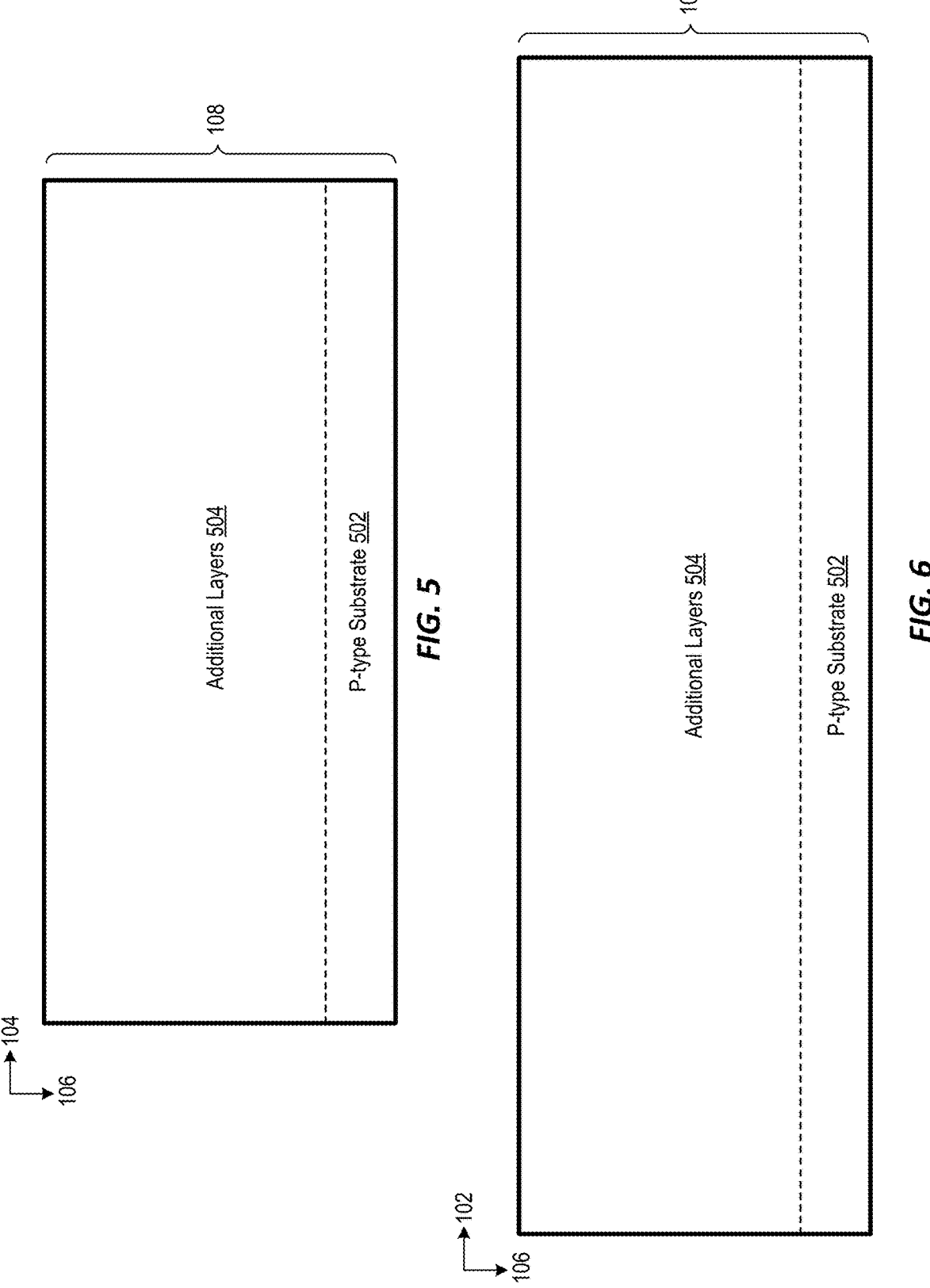
FIG. 5 is a cross-sectional view of the FIG. 1 semiconductor die taken along line 2A-2A of FIG. 1 illustrating one example embodiment of a semiconductor layer stack of the FIG. 1 semiconductor die.
FIG. 6 is a cross-sectional view of the FIG. 1 semiconductor die taken along line 3A-3A of FIG. 1 illustrating another perspective of the semiconductor layer stack depicted in FIG. 5.

FIGS. 5 and 6 collectively illustrate one example of semiconductor layer stack 108 in an embodiment where semiconductor die 100 is formed using a CMOS fabrication process. FIG. 5 is a cross-sectional view of semiconductor die 100 taken along line 2A-2A of FIG. 1, and FIG. 6 is a cross-sectional view of semiconductor die 100 taken along line 3A-3A of FIG. 1. FIGS. 5 and 6 differ from FIGS. 2 and 3, respectively, in that (i) FIGS. 5 and 6 do not symbolically show elements formed in semiconductor layer stack 108, and (ii) FIGS. 5 and 6 show features of semiconductor layer stack 108 not depicted in FIGS. 2 and 3. Semiconductor layer stack 108 includes a P-type substrate 502 and a plurality of additional layers 504 formed over P-type substrate 502 in direction 106, in the example embodiments of FIGS. 5 and 6. Additional layers 504 include, for example, one or more of N-type layers, P-type layers, intrinsic layers, conductive layers (e.g., form of polysilicon) and/or isolation layers (e.g., formed of silicon dioxide). The configuration of additional layers 504 will typically vary within the volume of semiconductor layer stack 108 according to the type of device being formed in semiconductor layer stack 108. For example, a portion of additional layers 504 forming a NMOS FET may include (i) doped silicon regions forming a drain and a source of the NMOS FET and (ii) a gate region adjacent to a channel between the drain and source regions, where the gate region includes a polysilicon layer and silicon dioxide layer. As another example, a portion of additional layers forming a trench capacitor may include (i) a trench formed in semiconductor layer stack 108, (ii) a dielectric layer lining the trench, such as a dielectric layer formed of silicon dioxide, and (iii) conductive materially filling the lined trench, such as polysilicon conductive material.

FIGS. 7-10 collectively illustrate two examples of how trench capacitors, such as bootstrap trench capacitors 128, first holding trench capacitor 124, and/or second holding trench capacitor 126, may be formed in semiconductor layer stack 108. However, the trench capacitors of semiconductor die 100 are not limited to the example embodiments of FIGS. 7-10.

Figures 7, 8:
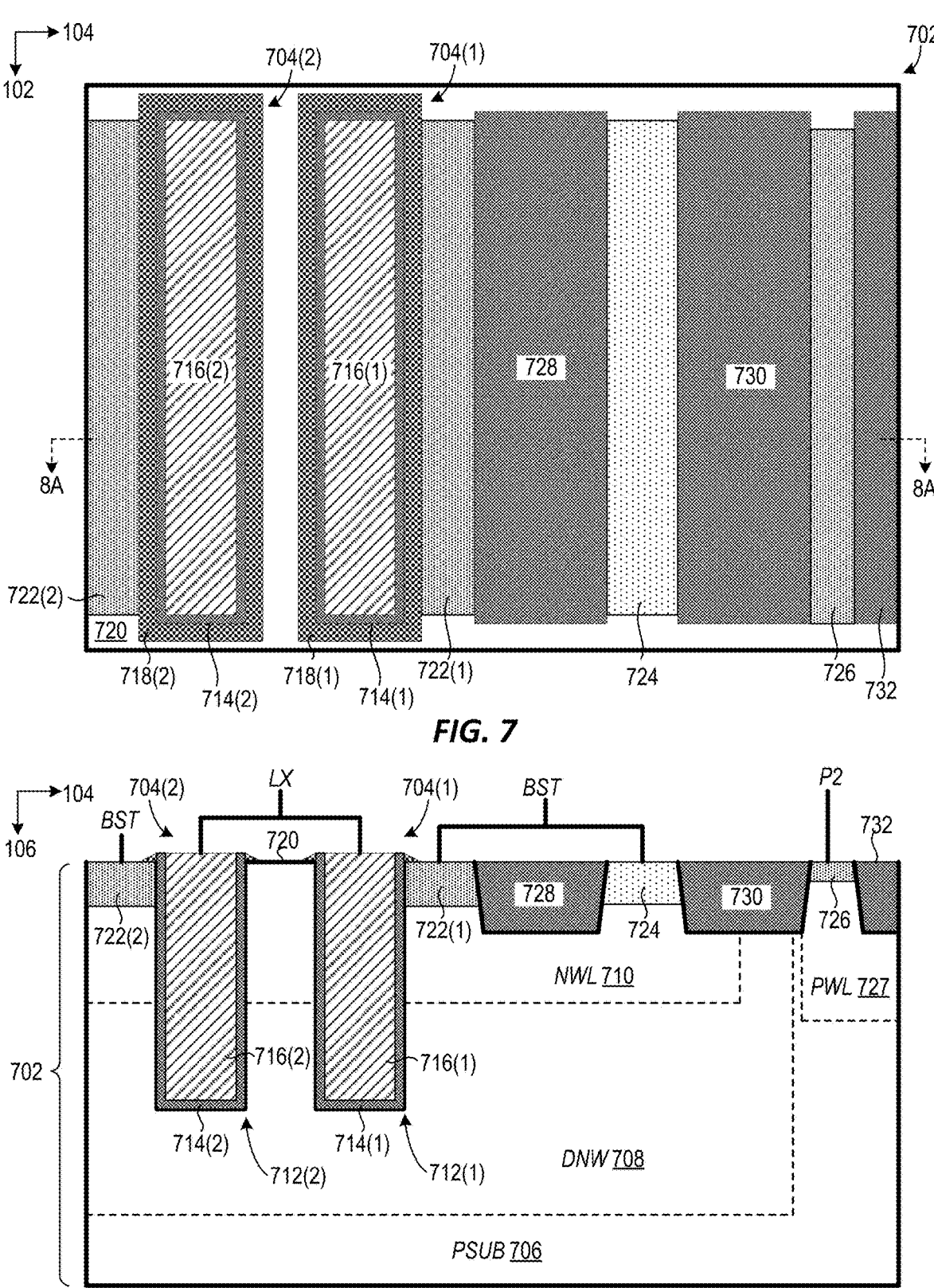
FIG. 7 is a top plan view of a portion of the semiconductor layer stack of the FIG. 1 semiconductor die illustrating one possible embodiment of trench capacitors of the semiconductor die.
FIG. 8 is a cross-sectional view of the portion of the semiconductor layer stack of FIG. 7 taken along line 8A-8A of FIG. 7.

FIG. 7 is top plan view of a portion 702 of semiconductor layer stack 108 forming two trench capacitors 704, and FIG. 8 is a cross-sectional view of portion 702 taken along line 8A-8A. Trench capacitors 704 are one embodiment of bootstrap trench capacitors 128 of FIGS. 1-3 in embodiments where semiconductor die 100 is formed using a CMOS fabrication process, although first holding trench capacitor 124 and second holding trench capacitor 126 could be embodied in a manner similar to trench capacitors 704. Although portion 702 is illustrated as forming two trench capacitors 704, it is understood that the quantity of trench capacitors 704 formed in portion 702 could vary as a design choice. Trench capacitors 704 have a P-type configuration.

Portion 702 includes a P-type substrate (PSUB) 706, a deep N-type well (DNW) 708 formed over PSUB 706 in direction 106, and an N-type well (NWL) 710 formed over DNW 708 in the direction 106, such that DNW 708 is disposed between PSUB 706 and NWL 710 in direction 106. Each trench capacitor 704 extends into each of DNW 708 and NWL 710 in direction 106. Specifically, each trench capacitor 704 is formed in a respective trench 712 extending into each of NWL 710 and DNW in direction 106, where each trench 712 is lined with a respective dielectric layer 714, and each lined trench 712 is filled with a respective conductive material 716. In some embodiments, dielectric layer 714 is formed of silicon dioxide, and conductive material 716 is formed of polysilicon. The respective conductive material 716 of each trench capacitor 704 may be considered a top plate terminal of the trench capacitor 704, and semiconductor material of portion 702 surrounding each trench capacitor 704 may be considered a bottom plate terminal of the trench capacitor 704. A respective passivation layer 718 surrounds each trench capacitor 704 on a top surface 720 of portion 702.

The top plate terminal of each trench capacitor 704 is electrically coupled to switching node LX. Bootstrap power rail BST is electrically coupled to NWL 710 via P+ doped regions 722 and an N+ doped region 724. Consequently, the bottom plate terminal of each trench capacitor 704 is electrically coupled to bootstrap power rail BST. Additionally, DNW 708 is electrically coupled to bootstrap power rail BST via NWL 710. PSUB 706 is electrically coupled to second power node P2 via a P+ doped region 726 of PSUB 706 of a P-type well (PWL) 727 of PSUB 706. Portion 702 further includes shallow trench isolation (STI) regions 728, 730, and 732, which help prevent flow of leakage current between trench capacitors 704 and elements of semiconductor die 100 adjacent to trench capacitors 704.

Applicant has determined that the configuration of portion 702 may be particularly advantageous. For example, the fact that DNW 708 is electrically coupled to bootstrap power rail BST (instead of switching node LX) helps prevent flow of leakage current when second NMOS FET 116 is in its on-state by reverse biasing a parasitic diode between PSUB 706 and DNW 708 when electrical potential of switching node LX is below electrical potential of second power node P2. As another example, DNW 708 helps isolate trench capacitors 704 from first NMOS FET 114 and second NMOS FET 116 (not shown in FIGS. 7 and 8). For instance, electrical potential of switching node LX may be below electrical potential of second power node P2 during a switching transition or during deadtime where both of first NMOS FET 114 and second NMOS FET 116 are in their respective off-states, which may cause substrate injection from second NMOS FET 116, thereby negatively impacting trench capacitors 704. DNW 708 helps separate trench capacitors 704 from first NMOS FET 114 and second NMOS FET 116, and substrate injections from NMOS FETs will therefore be captured by DNW 708 and routed to bootstrap power rail BST in view of DNW 708 being electrically coupled to bootstrap power rail BST. Additionally, the fact that DNW 708 is electrically coupled to bootstrap power rail BST and that the top plates of trench capacitors 704 are electrically coupled to switching node LX promotes large capacitance of trench capacitors 704.

One consideration when designing trench capacitors 704 is to ensure that trench capacitors 704 collectively exhibit sufficient capacitance to drive the gate of first NMOS FET 114 without excessive voltage drop on bootstrap power rail BST, to avoid significant increase in on-resistance of first NMOS FET 114 resulting from insufficient gate drive voltage magnitude. Some capacitance is lost through back plate parasitic capacitance of a junction diode formed by the junction of PSUB 706 and DNW 708. Additionally, other portions (not shown) of semiconductor layer stack 108 connected to bootstrap power rail BST cause further loss in capacitance of trench capacitors 704, referred to as overhead in trench capacitors 704. Applicant has found that in particular embodiments, trench capacitors 704 will have sufficient capacitance to drive the gate of first NMOS FET 114 when trench capacitors 704 have collective capacitance of approximately 25 times the gate capacitance of first NMOS FET 114. Accordingly, in particular embodiments, quantity and/or configuration of trench capacitors 704 is selected based on gate capacitance of first NMOS FET 114. For example, in some embodiments, trench capacitors 704 are configured to have a collective capacitance of approximately 25 times the gate capacitance of first NMOS FET 114 to prevent voltage of bootstrap power rail BST from dropping by more than five percent due to charge being transferred from trench capacitors 704 to the gate of first NMOS FET 114.

Figures 9, 10:
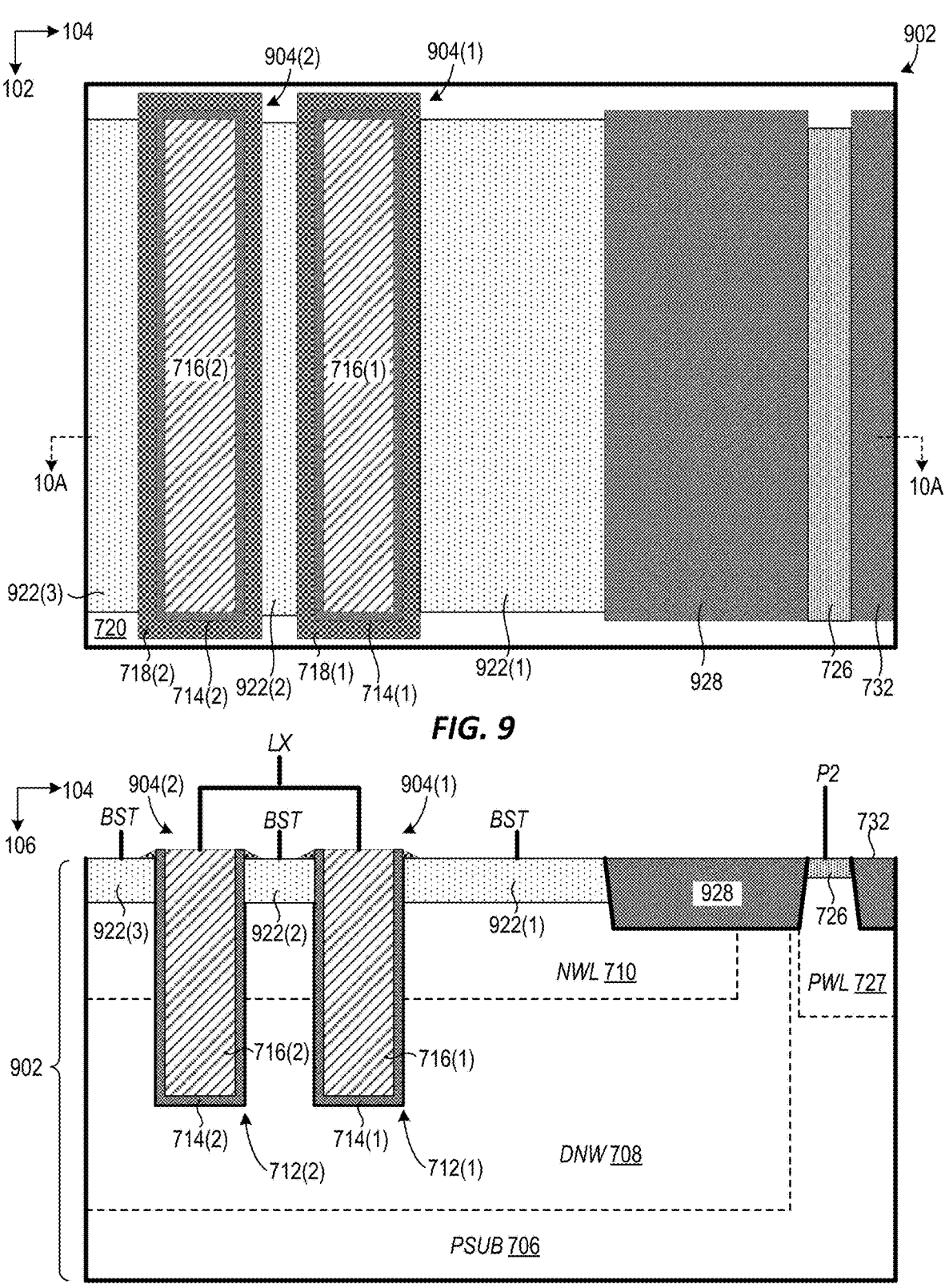
FIG. 9 is a top plan view of a portion of the semiconductor layer stack of the FIG. 1 semiconductor die illustrating another possible embodiment of trench capacitors of the semiconductor die.
FIG. 10 is a cross-sectional view of the portion of the semiconductor layer stack of FIG. 9 taken along line 10A-10A of FIG. 9.

FIG. 9 is top plan view of a portion 902 of semiconductor layer stack 108 forming two trench capacitors 904, and FIG. 10 is a cross-sectional view of portion 902 taken along line 10A-10A. Portion 902 is an alternate embodiment of portion 702 (FIGS. 7 and 8) where trench capacitors 904 have a N-type configuration instead of a P-type configuration. Portion 902 differs from portion 702 in that (i) NWL 710 is electrically coupled to bootstrap power rail BST via P+ doped regions 922, instead of via P+ doped regions 722 and N+ doped region 724, and (ii) STI regions 728 and 730 are replaced with a single STI region 928.

Figure 11:
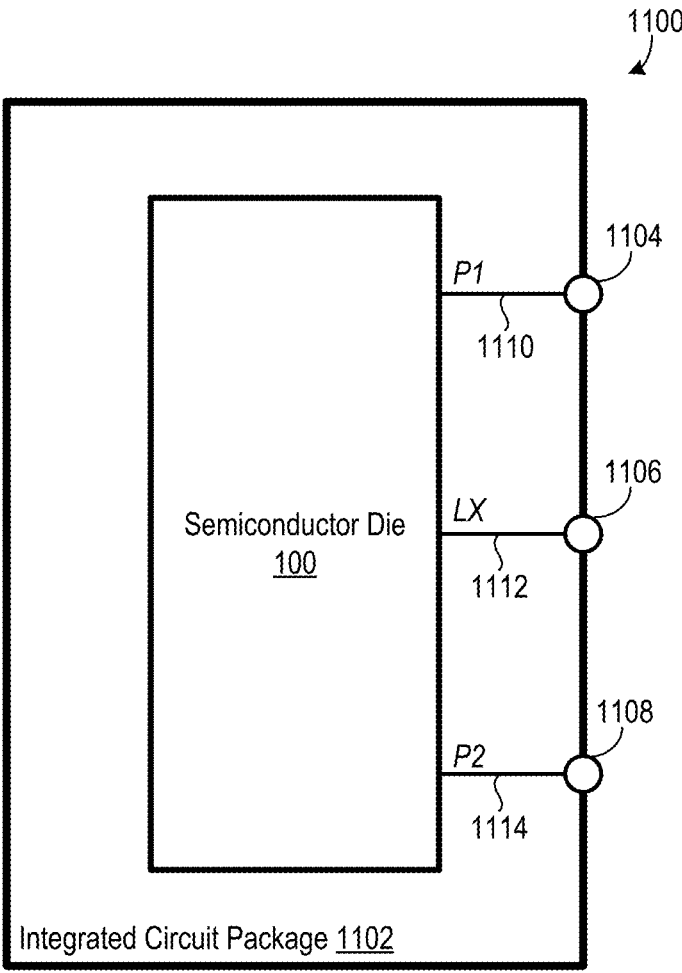
FIG. 11 is a block diagram of an integrated circuit including an instance of the FIG. 1 semiconductor die.

Referring again to FIG. 1, while not required, it is anticipated that semiconductor die 100 will typically be housed in an integrated circuit package. For example, FIG. 11 is a block diagram of an integrated circuit 1100 including an integrated circuit package 1102 and an instance of semiconductor die 100 housed in integrated circuit package 1102. Details of semiconductor die 100 are not shown in FIG. 11 for illustrative clarity. In some embodiments, integrated circuit package 1102 is configured for surface mount attachment to a substrate, such as a PCB, and in some other embodiments, integrated circuit package 1102 is configured for through-hole attachment to a PCB or other substrate. Integrated circuit package 1102 includes a first power terminal 1104, a switching terminal 1106, a second power terminal 1108, an electrical conductor 1110, an electrical conductor 1112, and an electrical conductor 1114. Each of first power terminal 1104, switching terminal 1106, second power terminal 1108 is configured to provide a respective electrical interface to integrated circuit 1100. For example, in some embodiments, each of first power terminal 1104, switching terminal 1106, second power terminal 1108 includes a respective electrically conductive solder pad or a respective electrically conductive pin. Each electrical conductor 1110, 1112, and 1114 includes, for example, a respective portion of an integrated circuit lead frame or a respective bond wire.

First power terminal 1104 is electrically coupled to first power node P1 via electrical conductor 1110, and the drain of first NMOS FET 114 is therefore electrically coupled to first power terminal 1104. Switching terminal 1106 is electrically coupled to switching node LX via electrical conductor 1112, each of the source of first NMOS FET 114 and the drain of second NMOS FET 116, as well as one side of bootstrap capacitance 122 (and each constituent bootstrap trench capacitor 128), is therefore electrically coupled to switching terminal 1106. Second power terminal 1108 is electrically coupled to second power node P2 via electrical conductor 1114, and the source of second NMOS FET 116 is therefore electrically coupled to second power terminal 1108. Integrated circuit 1100 can, and typically will, include additional features, such as additional terminals to provide further electrical interfaces to integrated circuit 1100.

Figure 12:
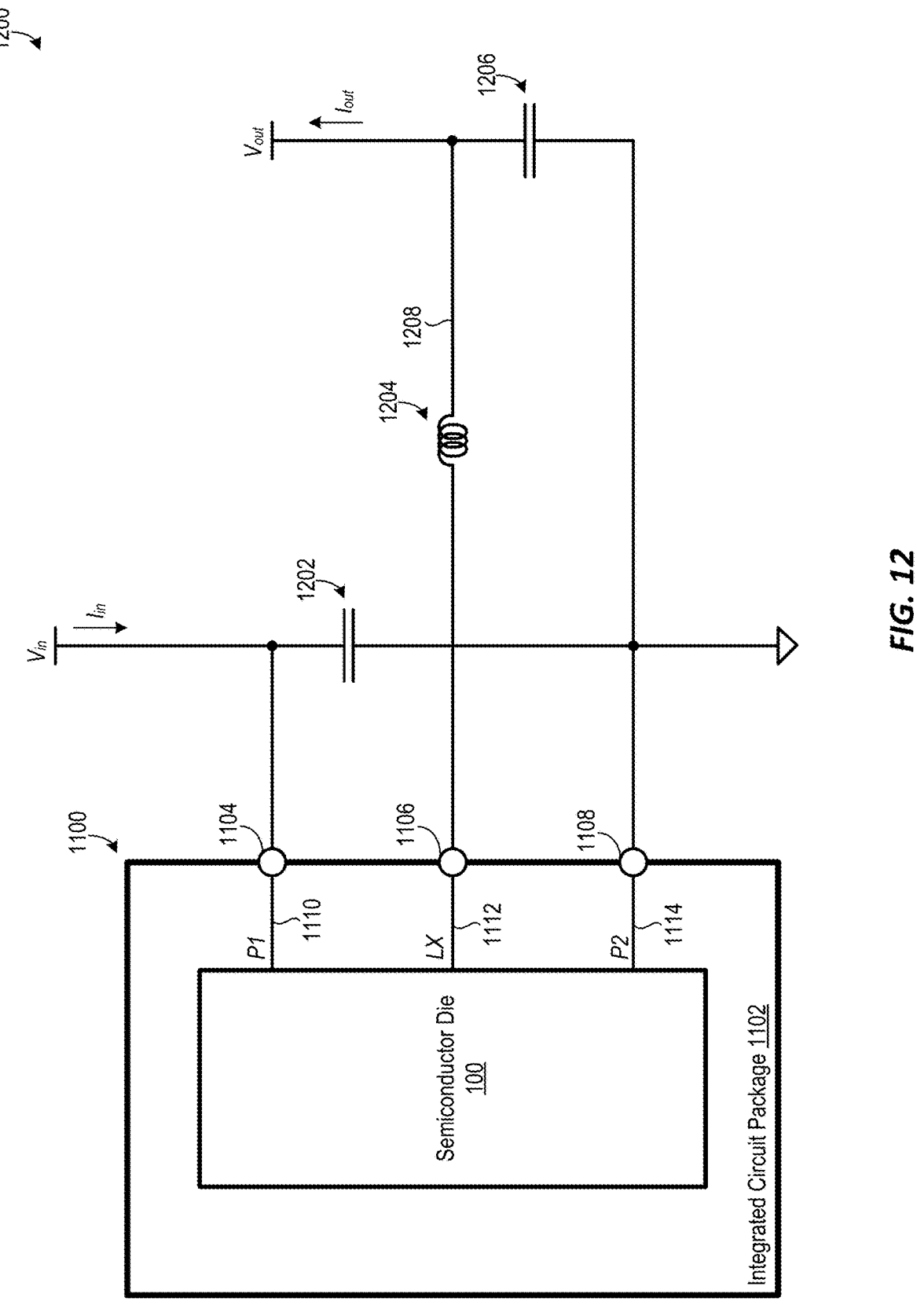
FIG. 12 is a schematic diagram of a buck converter including an instance of the FIG. 11 integrated circuit, according to an embodiment.

FIG. 12 is a schematic diagram of a buck converter 1200, which is one application of the new semiconductor dice disclosed herein. Buck converter 1200 includes an instance of integrated circuit 1100 (FIG. 11), an input capacitor 1202, an inductor 1204, and an output capacitor 1206. In buck converter 1200, first power node P1 is an input power node, and second power node P2 is a ground node. Input capacitor 1202 is electrically coupled between first power node P1 and second power node P2, and output capacitor 1206 is electrically coupled between an output power node 1208 and second power node P2. Inductor 1204 is electrically coupled between switching node LX and output power node 1208. Buck converter 1200 is configured to convert an input voltage $V_{in}$ on first power node P1 to an output voltage $V_{out}$ on output power node 1208, or vice versa. Buck converter 1200 is also configured to convert an input current $I_{in}$ flowing into buck converter 1200 at first power node P1 to an output current $I_{out}$ flowing out of buck converter 1200 at output power node 1208, or vice versa. Each of input current $I_{in}$ and output current $I_{out}$ could have either a positive polarity or a negative polarity. Input capacitor 1202 provides a path for input ripple current flowing into buck converter 1200. Output capacitor 1206 filters ripple current associated with first NMOS FET 114 and second NMOS FET 116 repeatedly charging and discharging inductor 1204. Output capacitor 1206 may also help support any transient loads (not shown) powered by buck converter 1200 via output power node 1208.

Figure 13:
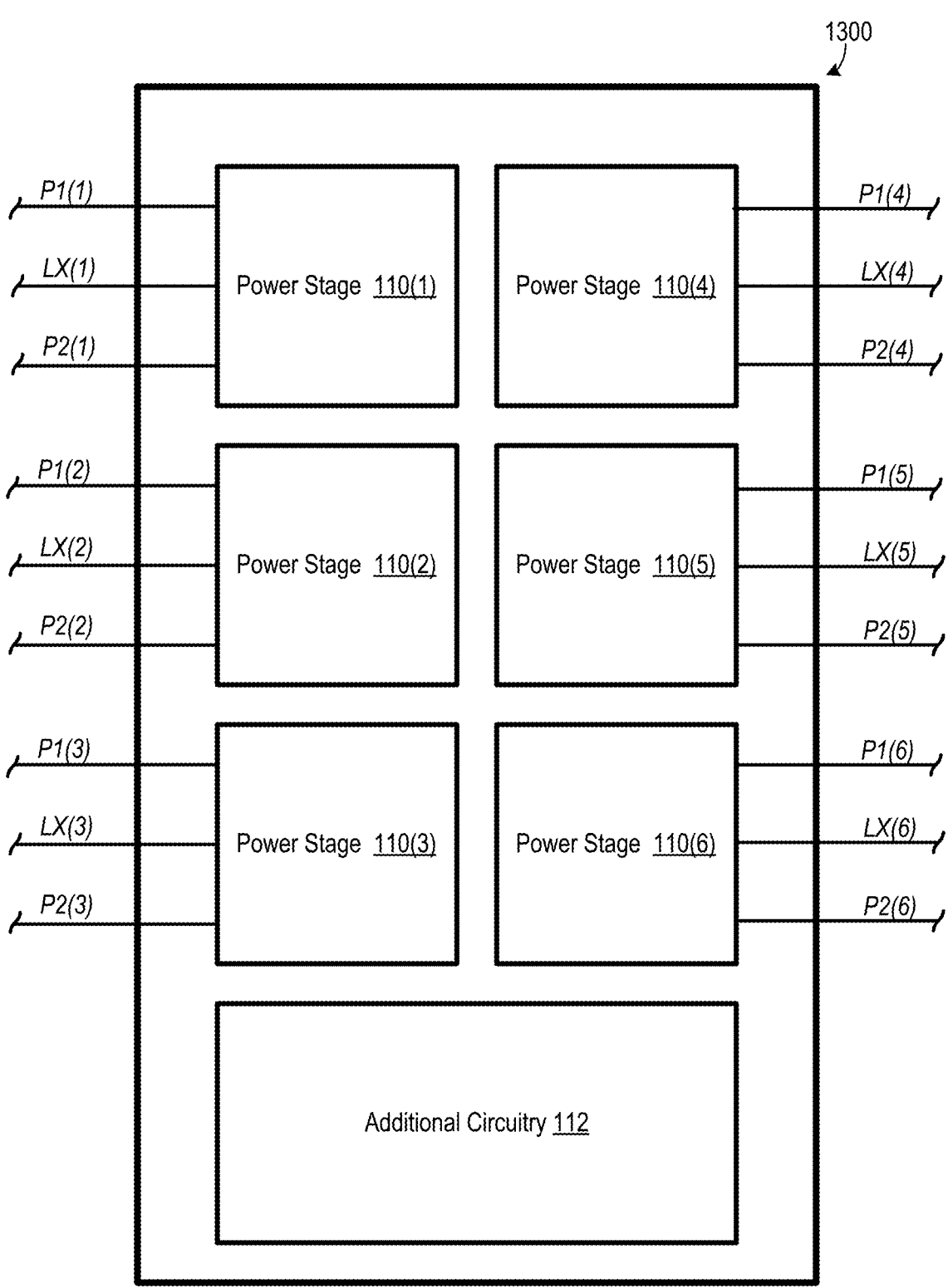
FIG. 13 is a block diagram of an alternate embodiment of the FIG. 1 semiconductor die including six power stages.

Referring again to FIG. 1, as discussed above, semiconductor die 100 could be modified to include additional features, such as additional power stages. For example, FIG. 13 is a block diagram of a semiconductor die 1300, which is an alternate embodiment of semiconductor die 100 (FIG. 1) including six instances of power stage 110, i.e., power stages 110(1), 110(2), 110(3), 110(4), 110(5), and 110(6), along with additional circuitry 112. Details of power stages 110 are not shown in FIG. 13 for illustrative clarity. Each power stage 110 is depicted as being electrically coupled to a respective first power node P1, a respective switching node LX, and a respective second power node P2. However, in some embodiments, at least two first power nodes P1 are common node, and in certain embodiments, at least two second power nodes P2 are a common node. For example, in embodiments where power stages 110(1) and 110(2) are powered from a common input power supply, first power node P1(1) and first power node P1(2) are a common input power node. As another example, in embodiments where each power stage 110(1) through 110(6) is referenced to ground, each second power node P2(1) through P2(6) is a common ground node. It should be appreciated that the fact that each power stage 110 in semiconductor die 1300 includes respective integrated bootstrap capacitance 122 (not shown in FIG. 13) eliminates six connections to external bootstrap capacitors that would be required if power stages 110 did not include respective integrated bootstrap capacitance.

Semiconductor die 1300 could be modified to add or remove elements. For example, the quantity of power stages 110 in semiconductor die 1300 could vary. As another example, semiconductor die 1300 could further include respective power stages for one or more linear regulators, such as low dropout linear regulators.

Combinations of Features

Features described above may be combined in various ways without departing from the scope hereof. The following examples illustrate some possible combinations.

(A1) A semiconductor die for an inductor-based switching power converter includes (i) a semiconductor layer stack, (ii) a first enhancement mode, N-channel metal oxide semiconductor field effect transistor (first NMOS FET) formed in the semiconductor layer stack, the first NMOS FET including a first drain, a first source, and a first gate, the first drain being electrically coupled to a first power node, and the first source being electrically coupled to a switching node, (iii) a second enhancement mode, N-channel metal oxide semiconductor field effect transistor (second NMOS FET) formed in the semiconductor layer stack, the second NMOS FET including a second drain, a second source, and a second gate, the second drain being electrically coupled to the switching node, and the second source being electrically coupled to a second power node, (iv) first driver circuitry formed in the semiconductor layer stack and configured to drive the first gate from a bootstrap power rail in response to a first control signal, (v) second driver circuitry formed in the semiconductor layer stack and configured to drive the second gate in response to a second control signal, and (vi) bootstrap capacitance including one or more bootstrap trench capacitors formed in the semiconductor layer stack, each bootstrap capacitor being electrically coupled between the bootstrap power rail and the switching node.

(A2) In the semiconductor die denoted as (A1), a respective bottom plate terminal of each of the one or more bootstrap trench capacitors may be electrically coupled to the bootstrap power rail.

(A3) In either of the semiconductor dice denoted as (A1) or (A2), (i) the semiconductor layer stack may include a P-type substrate (PSUB) and a deep N-type well (DNW) formed over the PSUB in a first direction, and (ii) each bootstrap trench capacitor may extend into the DNW in the first direction.

(A4) In the semiconductor die denoted as (A3), the DNW may be electrically coupled to the bootstrap power rail.

(A5) In either of the semiconductor dice denoted as (A3) or (A4), (i) the semiconductor layer stack may further include a N-type well (NWL) formed over the DNW in the first direction such that the DNW is disposed between the PSUB and the NWL in the first direction, and (ii) each bootstrap trench capacitor may extend into the NWL in the first direction.

(A6) In any one of the semiconductor dice denoted as (A3) through (A5), the PSUB may be electrically coupled to the second power node.

(A7) In any one of the semiconductor dice denoted as (A1) through (A6), a respective top plate terminal of each of the one or more bootstrap trench capacitors may be electrically coupled to the switching node.

(A8) In any one of the semiconductor dice denoted as (A1) through (A7), (i) each bootstrap trench capacitor may be formed in a respective trench in the semiconductor layer stack, (ii) each bootstrap trench capacitor may include a respective dielectric layer lining its respective trench in the semiconductor layer stack, and (iii) each bootstrap trench capacitor may include respective conductive material filling its respective trench in the semiconductor layer stack.

(A9) Any one of the semiconductor dice denoted as (A1) through (A8) may further include bootstrap control circuitry formed in the semiconductor layer stack and configured to control charging of the bootstrap capacitance.

(A10) In any one of the semiconductor dice denoted as (A1) through (A9), the semiconductor layer stack may be formed according to a complementary metal oxide semiconductor (CMOS) fabrication process.

(B1) An integrated circuit for an inductor-based switching power converter includes (1) an integrated circuit package including a first power terminal, a switching terminal, and a second power terminal, and (2) a semiconductor die housed in the integrated circuit package. The semiconductor die includes (i) a semiconductor layer stack, (ii) a first enhancement mode, N-type metal oxide semiconductor field effect transistor (first NMOS FET) formed in the semiconductor layer stack, the first NMOS FET including a first drain, a first source, and a first gate, the first drain being electrically coupled to the first power terminal, and the first source being electrically coupled to the switching terminal, (iii) a second enhancement mode, N-type metal oxide semiconductor field effect transistor (second NMOS FET) formed in the semiconductor layer stack, the second NMOS FET including a second drain, a second source, and a second gate, the second drain being electrically coupled to the switching terminal, and the second source being electrically coupled to the second power terminal, (iv) first driver circuitry formed in the semiconductor layer stack and configured to drive the first gate from a bootstrap power rail in response to a first control signal, (v) second driver circuitry formed in the semiconductor layer stack and configured to drive the second gate in response to a second control signal, and (vi) bootstrap capacitance including one or more bootstrap trench capacitors formed in the semiconductor layer stack, each bootstrap capacitor being electrically coupled between the bootstrap power rail and the switching terminal.

(B2) In the integrated circuit denoted as (B1), a respective bottom plate terminal of each of the one or more bootstrap trench capacitors may be electrically coupled to the bootstrap power rail.

(B3) In either of the integrated circuits denoted as (B1) or (B2), (i) the semiconductor layer stack may include a P-type substrate (PSUB) and a deep N-type well (DNW) formed over the PSUB in a first direction, (ii) each bootstrap trench capacitor may extend into the DNW in the first direction, (iii) the DNW may be electrically coupled to the bootstrap power rail, and (iv) the PSUB may be electrically coupled to the second power terminal.

(B4) In the integrated circuit denoted as (B3), (i) the semiconductor layer stack may further include a N-type well (NWL) formed over the DNW in the first direction such that the DNW is disposed between the PSUB and the NWL in the first direction, and (ii) each bootstrap trench capacitor may extend into the NWL in the first direction.

(B5) In any one of the integrated circuits denoted as (B1) through (B4), a respective top plate terminal of each of the one or more bootstrap trench capacitors may be electrically coupled to the switching terminal.

(B6) In any one of the integrated circuits denoted as (B1) through (B5), the semiconductor layer stack may be formed according to a complementary metal oxide semiconductor (CMOS) fabrication process.

(C1) A switching power converter includes an integrated circuit and an inductor. The integrated circuit includes (1) an integrated circuit package including a first power terminal, a switching terminal, and a second power terminal, and (2) a semiconductor die housed in the integrated circuit package. The semiconductor die includes (i) a semiconductor layer stack, (ii) a first enhancement mode, N-type metal oxide semiconductor field effect transistor (first NMOS FET) formed in the semiconductor layer stack, the first NMOS FET including a first drain, a first source, and a first gate, the first drain being electrically coupled to the first power terminal, and the first source being electrically coupled to the switching terminal, (iii) a second enhancement mode, N-type metal oxide semiconductor field effect transistor (second NMOS FET) formed in the semiconductor layer stack, the second NMOS FET including a second drain, a second source, and a second gate, the second drain being electrically coupled to the switching terminal, and the second source being electrically coupled to the second power terminal, (iv) first driver circuitry formed in the semiconductor layer stack and configured to drive the first gate from a bootstrap power rail in response to a first control signal, (v) second driver circuitry formed in the semiconductor layer stack and configured to drive the second gate in response to a second control signal, and (vi) bootstrap capacitance including one or more bootstrap trench capacitors formed in the semiconductor layer stack, each bootstrap capacitor being electrically coupled between the bootstrap power rail and the switching terminal. The inductor is electrically coupled to the switching terminal.

(C2) In the switching power converter denoted as (C1), (i) a respective bottom plate terminal of each of the one or more bootstrap trench capacitors may be electrically coupled to the bootstrap power rail, and (ii) a respective top plate terminal of each of the one or more bootstrap trench capacitors may be electrically coupled to the switching terminal.

(C3) In either one of the switching power converters denoted as (C1) or (C2), (i) the semiconductor layer stack may be formed according to a complementary metal oxide semiconductor (CMOS) fabrication process, (ii) the semiconductor layer stack may include a P-type substrate (PSUB), a deep N-type well (DNW) formed over the PSUB in a first direction, and an N-type well (NWL) formed over the DNW in the first direction such that the DNW is disposed between the PSUB and the NWL in the first direction, (iii) each bootstrap trench capacitor may extend into each of the NWL and the DNW in the first direction, (iv) the DNW may be electrically coupled to the bootstrap power rail, and (v) the PSUB may be electrically coupled to the second power terminal.

(C4) In any one of the switching power converters denoted as (C1) through (C3), the switching power converter may be a buck converter.

Changes may be made in the above methods, devices, and systems without departing from the scope hereof. For example, although the new semiconductor dice are primarily discussed above with respect to buck converters, the new semiconductor dice could be configured to support other inductor-based switching power converter topologies, such as boost topologies and buck-boost topologies. It should thus be noted that the matter contained in the above description and shown in the accompanying drawings should be interpreted as illustrative and not in a limiting sense. The following claims are intended to cover generic and specific features described herein, as well as all statements of the scope of the present method and system, which as a matter of language, might be said to fall therebetween.

What is claimed is:

1. A semiconductor die for an inductor-based switching power converter, the semiconductor die comprising:
    a semiconductor layer stack comprising:
        a P-type substrate (PSUB) and a deep N-type well (DNW) formed over the PSUB in a first direction, and
        an N-type well (NWL) formed over the DNW in the first direction such that the DNW is disposed between the PSUB and the NWL in the first direction;
    a first enhancement mode, N-channel metal oxide semiconductor field effect transistor (first NMOS FET) formed in the semiconductor layer stack, the first NMOS FET including a first drain, a first source, and a first gate, the first drain being electrically coupled to a first power node, and the first source being electrically coupled to a switching node;
    a second enhancement mode, N-channel metal oxide semiconductor field effect transistor (second NMOS FET) formed in the semiconductor layer stack, the second NMOS FET including a second drain, a second source, and a second gate, the second drain being electrically coupled to the switching node, and the second source being electrically coupled to a second power node;
    first driver circuitry formed in the semiconductor layer stack and configured to drive the first gate from a bootstrap power rail in response to a first control signal;
    second driver circuitry formed in the semiconductor layer stack and configured to drive the second gate in response to a second control signal; and
    bootstrap capacitance including one or more bootstrap trench capacitors formed in the semiconductor layer stack, each bootstrap trench capacitor being electrically coupled between the bootstrap power rail and the switching node, and each bootstrap trench capacitor extends into each of the DNW and the NWL in the first direction,
    wherein the DNW is electrically coupled to the bootstrap power rail and the PSUB is electrically coupled to the second power node.

2. The semiconductor die of claim 1, wherein a respective bottom plate terminal of each of the one or more bootstrap trench capacitors is electrically coupled to the bootstrap power rail.

3. The semiconductor die of claim 1, wherein a respective top plate terminal of each of the one or more bootstrap trench capacitors is electrically coupled to the switching node.

4. The semiconductor die of claim 1, wherein:
    each bootstrap trench capacitor is formed in a respective trench in the semiconductor layer stack;
    each bootstrap trench capacitor includes a respective dielectric layer lining its respective trench in the semiconductor layer stack; and
    each bootstrap trench capacitor includes respective conductive material filling its respective trench in the semiconductor layer stack.

5. The semiconductor die of claim 1, further comprising bootstrap control circuitry formed in the semiconductor layer stack and configured to control charging of the bootstrap capacitance.

6. The semiconductor die of claim 1, wherein the semiconductor layer stack is formed according to a complementary metal oxide semiconductor (CMOS) fabrication process.

7. An integrated circuit for an inductor-based switching power converter, the integrated circuit comprising:
    an integrated circuit package including a first power terminal, a switching terminal, and a second power terminal; and
    a semiconductor die housed in the integrated circuit package, the semiconductor die including:
        a semiconductor layer stack comprising:
            a P-type substrate (PSUB) and a deep N-type well (DNW) formed over the PSUB in a first direction, and
            an N-type well (NWL) formed over the DNW in the first direction such that the DNW is disposed between the PSUB and the NWL in the first direction,
        a first enhancement mode, N-type metal oxide semiconductor field effect transistor (first NMOS FET) formed in the semiconductor layer stack, the first NMOS FET including a first drain, a first source, and a first gate, the first drain being electrically coupled to the first power terminal, and the first source being electrically coupled to the switching terminal, a second enhancement mode, N-type metal oxide semiconductor field effect transistor (second NMOS FET) formed in the semiconductor layer stack, the second NMOS FET including a second drain, a second source, and a second gate, the second drain being electrically coupled to the switching terminal, and the second source being electrically coupled to the second power terminal, first driver circuitry formed in the semiconductor layer stack and configured to drive the first gate from a bootstrap power rail in response to a first control signal, second driver circuitry formed in the semiconductor layer stack and configured to drive the second gate in response to a second control signal, and bootstrap capacitance including one or more bootstrap trench capacitors formed in the semiconductor layer stack, each bootstrap trench capacitor being electrically coupled between the bootstrap power rail and the switching terminal and extending into the DNW and the NWL in the first direction, wherein the DNW is electrically coupled to the bootstrap power rail and the PSUB is electrically coupled to the second power terminal.

8. The integrated circuit of claim 7, wherein a respective bottom plate terminal of each of the one or more bootstrap trench capacitors is electrically coupled to the bootstrap power rail.

9. The integrated circuit of claim 7, wherein a respective top plate terminal of each of the one or more bootstrap trench capacitors is electrically coupled to the switching terminal.

10. The integrated circuit of claim 7, wherein the semiconductor layer stack is formed according to a complementary metal oxide semiconductor (CMOS) fabrication process.

11. A switching power converter, comprising:

an integrated circuit, the integrated circuit including:

an integrated circuit package including a first power terminal, a switching terminal, and a second power terminal, and a semiconductor die housed in the integrated circuit package, the semiconductor die including:

a semiconductor layer stack including a P-type substrate (PSUB), a deep N-type well (DNW) formed over the PSUB in a first direction, and an N-type well (NWL) formed over the DNW in the first direction such that the DNW is disposed between the PSUB and the NWL in the first direction, a first enhancement mode, N-type metal oxide semiconductor field effect transistor (first NMOS FET) formed in the semiconductor layer stack, the first NMOS FET including a first drain, a first source, and a first gate, the first drain being electrically coupled to the first power terminal, and the first source being electrically coupled to the switching terminal, a second enhancement mode, N-type metal oxide semiconductor field effect transistor (second NMOS FET) formed in the semiconductor layer stack, the second NMOS FET including a second drain, a second source, and a second gate, the second drain being electrically coupled to the switching terminal, and the second source being electrically coupled to the second power terminal, first driver circuitry formed in the semiconductor layer stack and configured to drive the first gate from a bootstrap power rail in response to a first control signal, second driver circuitry formed in the semiconductor layer stack and configured to drive the second gate in response to a second control signal, and bootstrap capacitance including one or more bootstrap trench capacitors formed in the semiconductor layer stack, each bootstrap trench capacitor being electrically coupled between the bootstrap power rail and the switching terminal, each bootstrap trench capacitor extending into each of the NWL and the DNW in the first direction, wherein the DNW is electrically coupled to the bootstrap power rail and the PSUB is electrically coupled to the second power terminal; and an inductor electrically coupled to the switching terminal.

12. The switching power converter of claim 11, wherein:

a respective bottom plate terminal of each of the one or more bootstrap trench capacitors is electrically coupled to the bootstrap power rail; and a respective top plate terminal of each of the one or more bootstrap trench capacitors is electrically coupled to the switching terminal.

13. The switching power converter of claim 11, wherein the switching power converter is a buck converter.

* * * * *